(12) United States Patent
Huang et al.

(10) Patent No.: US 10,872,871 B2
(45) Date of Patent: Dec. 22, 2020

(54) CHIP PACKAGE STRUCTURE WITH DUMMY BUMP AND METHOD FOR FORMING THE SAME

(71) Applicant: Taiwan Semiconductor Manufacturing Co., Ltd., Hsinchu (TW)

(72) Inventors: Sung-Hui Huang, Dongshan Township, Yilan County (TW); Kuan-Yu Huang, Taipei (TW); Shang-Yun Hou, Jubei (TW); Yushun Lin, Taipei (TW); Heh-Chang Huang, Hsinchu (TW); Shu-Chia Hsu, Hsinchu (TW); Pai-Yuan Li, Taichung (TW); Kung-Chen Yeh, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/405,429

(22) Filed: May 7, 2019

(65) Prior Publication Data
US 2020/0203299 A1    Jun. 25, 2020

Related U.S. Application Data

(60) Provisional application No. 62/783,421, filed on Dec. 21, 2018.

(51) Int. Cl.
*H01L 21/56* (2006.01)
*H01L 23/00* (2006.01)
(Continued)

(52) U.S. Cl.
CPC ............ *H01L 24/17* (2013.01); *H01L 21/563* (2013.01); *H01L 23/5226* (2013.01);
(Continued)

(58) Field of Classification Search
CPC . H01L 21/304; H01L 21/3043; H01L 21/563; H01L 21/78; H01L 2223/54453;
(Continued)

(56) References Cited

U.S. PATENT DOCUMENTS 9,343,431 B2    5/2016 Shih et al.
9,368,456 B2    6/2016 Chung
(Continued)

FOREIGN PATENT DOCUMENTS

TW    201543631 A    11/2015

*Primary Examiner* — Cuong Q Nguyen
(74) *Attorney, Agent, or Firm* — Birch, Stewart, Kolasch & Birch, LLP

(57) ABSTRACT

A method for forming a chip package structure is provided. The method includes bonding a chip to a first surface of a first substrate. The method includes forming a dummy bump over a second surface of the first substrate. The first surface is opposite the second surface, and the dummy bump is electrically insulated from the chip. The method includes cutting through the first substrate and the dummy bump to form a cut substrate and a cut dummy bump. The cut dummy bump is over a corner portion of the cut substrate, a first sidewall of the cut dummy bump is substantially coplanar with a second sidewall of the cut substrate, and a third sidewall of the cut dummy bump is substantially coplanar with a fourth sidewall of the cut substrate.

20 Claims, 16 Drawing Sheets

(51) Int. Cl.
*H01L 23/522* (2006.01)
*H01L 23/528* (2006.01)

(52) U.S. Cl.
CPC .......... *H01L 23/5283* (2013.01); *H01L 24/09* (2013.01); *H01L 24/11* (2013.01); *H01L 2224/02373* (2013.01); *H01L 2224/02381* (2013.01); *H01L 2224/0401* (2013.01); *H01L 2224/11011* (2013.01)

(58) Field of Classification Search
CPC ... H01L 2223/5446; H01L 2223/54473; H01L 23/5226; H01L 23/5283
See application file for complete search history.

(56) References Cited

U.S. PATENT DOCUMENTS

| | | | |
|---|---|---|---|
| 9,793,222 B1* | 10/2017 | Lee | H01L 21/561 |
| 2012/0068353 A1 | 3/2012 | Huang et al. | |
| 2014/0326856 A1* | 11/2014 | Massetti | H01L 24/11 |
| | | | 250/208.1 |
| 2015/0061127 A1 | 3/2015 | Chen et al. | |

* cited by examiner

CHIP PACKAGE STRUCTURE WITH DUMMY BUMP AND METHOD FOR FORMING THE SAME

PRIORITY CLAIM AND CROSS-REFERENCE

This Application claims the benefit of U.S. Provisional Application No. 62/783,421, filed on Dec. 21, 2018, and entitled "CHIP PACKAGE WITH DAM STRUCTURE AND METHOD FOR FORMING THE SAME", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits are typically manufactured on a semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1D-1 is a top view of the chip package structure of FIG. 1D, in accordance with some embodiments.

FIG. 1E-1 is a top view of one of the chip package structures of FIG. 1E, in accordance with some embodiments.

FIG. 1E-2 is a cross-sectional view illustrating the chip package structure along a sectional line II-II' in FIG. 1E-1, in accordance with some embodiments.

FIG. 1F-1 is a top view of the chip package structure of FIG. 1F, in accordance with some embodiments.

FIG. 1F-2 is a cross-sectional view illustrating the chip package structure along a sectional line II-II' in FIG. 1F-1, in accordance with some embodiments.

FIG. 2 is a top view of the chip package structure of FIG. 1F, in accordance with some embodiments.

FIG. 3A-1 is a bottom view of the chip package structure of FIG. 3A, in accordance with some embodiments.

DETAILED DESCRIPTION

Figure 1A:
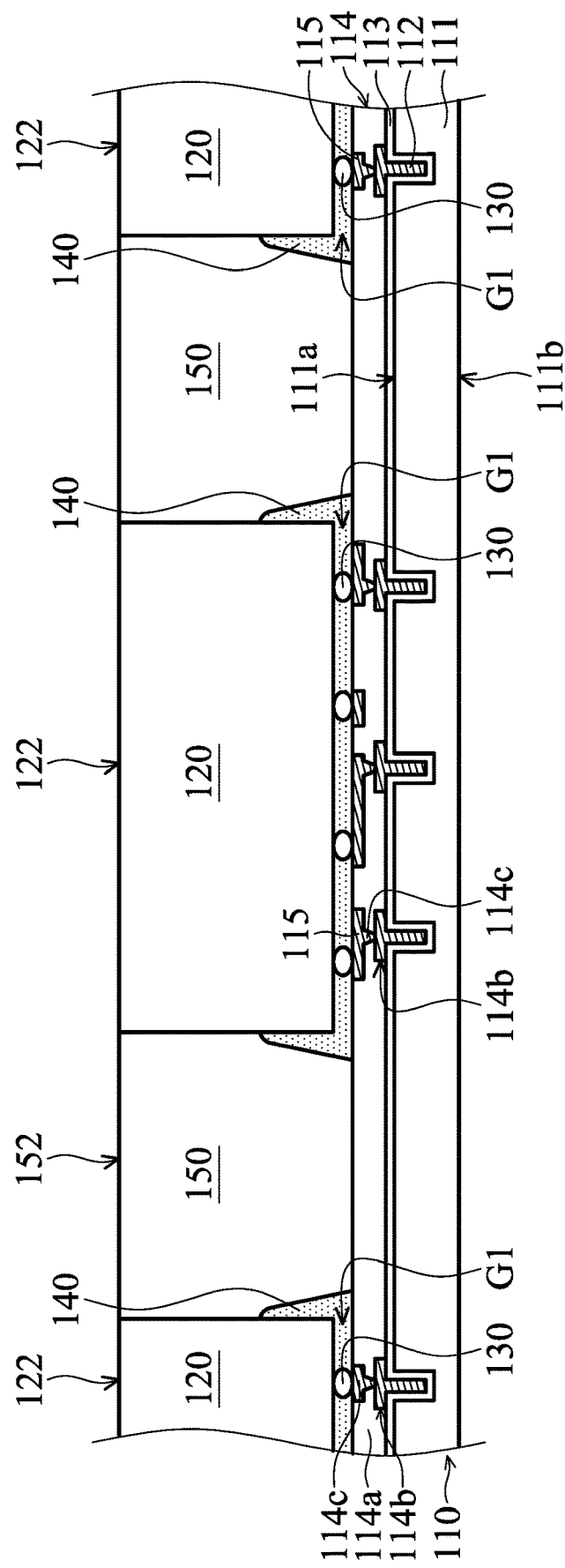
FIGS. 1A-1G are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1G are cross-sectional views of various stages of a process for forming a chip package structure, in accordance with some embodiments. As shown in FIG. 1A, a substrate 110 is provided, in accordance with some embodiments. In some embodiments, the substrate 110 is an interposer wafer. The substrate 110 includes a semiconductor structure 111, conductive vias 112, an insulating layer 113, a redistribution structure 114, and conductive pads 115, in accordance with some embodiments.

The semiconductor structure 111 has surfaces 111a and 111b, in accordance with some embodiments. In some embodiments, the semiconductor structure 111 is made of an elementary semiconductor material including silicon or germanium in a single crystal, polycrystal, or amorphous structure.

In some other embodiments, the semiconductor structure 111 is made of a compound semiconductor (e.g., silicon carbide, gallium arsenide, gallium phosphide, indium phosphide, or indium arsenide), an alloy semiconductor (e.g., SiGe or GaAsP), or a combination thereof. The semiconductor structure 111 may also include multi-layer semiconductors, semiconductor on insulator (SOI) (such as silicon on insulator or germanium on insulator), or a combination thereof.

The conductive vias 112 are formed in the semiconductor structure 111, in accordance with some embodiments. The conductive vias 112 may be formed to extend from the surface 111a into the semiconductor structure 111. The insulating layer 113 is formed over the semiconductor structure 111, in accordance with some embodiments. The insulating layer 113 is between the conductive vias 112 and the semiconductor structure 111, in accordance with some embodiments.

The insulating layer 113 is configured to electrically insulate the conductive vias 112 from the semiconductor structure 111, in accordance with some embodiments. The insulating layer 113 is made of an oxide-containing material such as silicon oxide, in accordance with some embodiments. The insulating layer 113 is formed using an oxidation process, a deposition process, or another suitable process.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at the surface 111a. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BIT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in the active regions. In some embodiments, the isolation features include shallow trench isolation (STI) features, local oxidation of silicon (LOCOS) features, other suitable isolation features, or a combination thereof.

The redistribution structure 114 is formed over the semiconductor structure 111, in accordance with some embodiments. The conductive pads 115 are formed over the redistribution structure 114, in accordance with some embodiments. The redistribution structure 114 includes a dielectric layer 114a, wiring layers 114b, and conductive vias 114c, in accordance with some embodiments. The dielectric layer 114a is formed over the surface 111a, in accordance with some embodiments. The wiring layers 114b are formed in the dielectric layer 114a, in accordance with some embodiments.

As shown in FIG. 1A, the conductive vias 114c are electrically connected between different wiring layers 114b and between the wiring layer 114b and the conductive pads 115, in accordance with some embodiments. For the sake of simplicity, FIG. 1A only shows one of the wiring layers 114b, in accordance with some embodiments. The conductive vias 112 are electrically connected to the conductive pads 115 through the wiring layers 114b and the conductive vias 114c, in accordance with some embodiments.

As shown in FIG. 1A, the chip structures 120 are bonded to the substrate 110 through the conductive bumps 130 between the chip structure 120 and the substrate 110, in accordance with some embodiments. The chip structures 120 are spaced apart from the substrate 110, in accordance with some embodiments. There are gaps G1 between the chip structure 120 and the substrate 110, in accordance with some embodiments. The conductive bumps 130 are in the gaps G1, in accordance with some embodiments.

The chip structures 120 are spaced apart from each other, in accordance with some embodiments. Each chip structure 120 includes a chip, such as a system on chip (SoC), in accordance with some embodiments. The chip structure 120 includes various device elements, in accordance with some embodiments. In some embodiments, the various device elements are formed in the chip structure 120. The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MO SFET), complementary metal oxide semiconductor (CMOS) transistors, bipolar junction transistors (BIT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the chip structure 120. The isolation features are used to define active regions and electrically isolate various device elements formed in the active regions. In some embodiments, the isolation features include shallow trench isolation (STI) features, local oxidation of silicon (LOCOS) features, other suitable isolation features, or a combination thereof. In some other embodiments, the chip structure 120 includes a chip package structure.

As shown in FIG. 1A, an underfill layer 140 is formed into the gaps G1 between the substrate 110 and each of the chip structures 120, in accordance with some embodiments. The underfill layer 140 surrounds the conductive bumps 130 and the chip structures 120, in accordance with some embodiments. The underfill layer 140 includes a polymer material, in accordance with some embodiments.

As shown in FIG. 1A, a molding layer 150 is formed over the substrate 110, in accordance with some embodiments. The molding layer 150 surrounds the chip structures 120, the underfill layer 140, and the conductive bumps 130, in accordance with some embodiments. The molding layer 150 includes a polymer material, in accordance with some embodiments. The top surfaces 122 and 152 of the chip structures 120 and the molding layer 150 are substantially coplanar, in accordance with some embodiments.

Figure 1B:
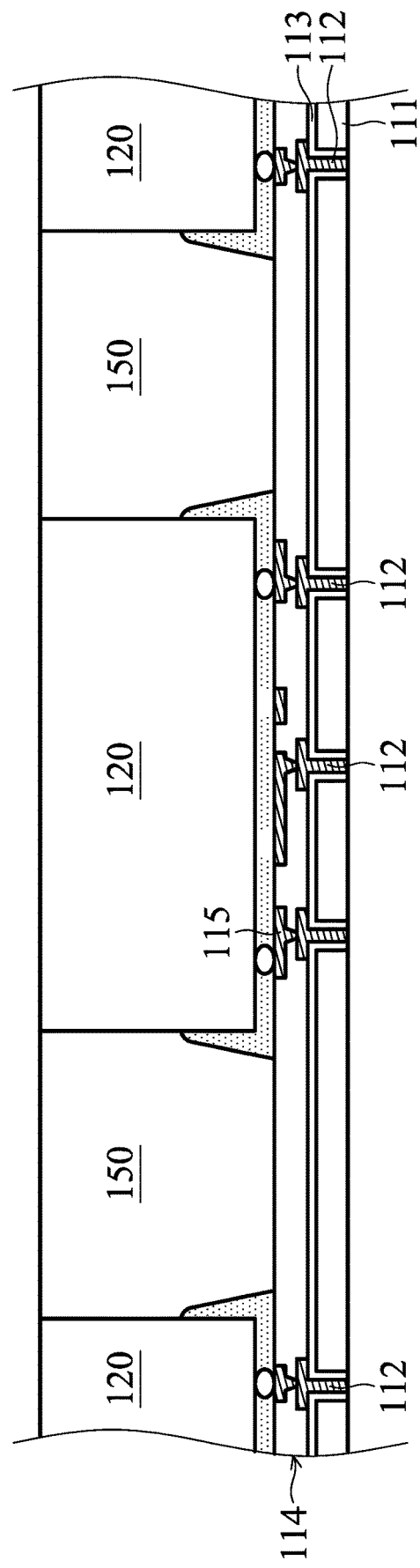

As shown in FIG. 1B, a lower portion of the semiconductor structure 111 is removed, in accordance with some embodiments. The removal process includes a chemical mechanical polishing (CMP) process, in accordance with some embodiments. After the removal process, the conductive vias 112 and the insulating layer 113 are exposed, in accordance with some embodiments.

The conductive vias 112 and the insulating layer 113 pass through the semiconductor structure 111, in accordance with some embodiments. The conductive vias 112 are also referred to as through-substrate vias or through-silicon vias when the semiconductor structure 111 is a silicon substrate, in accordance with some embodiments.

Figure 1C:
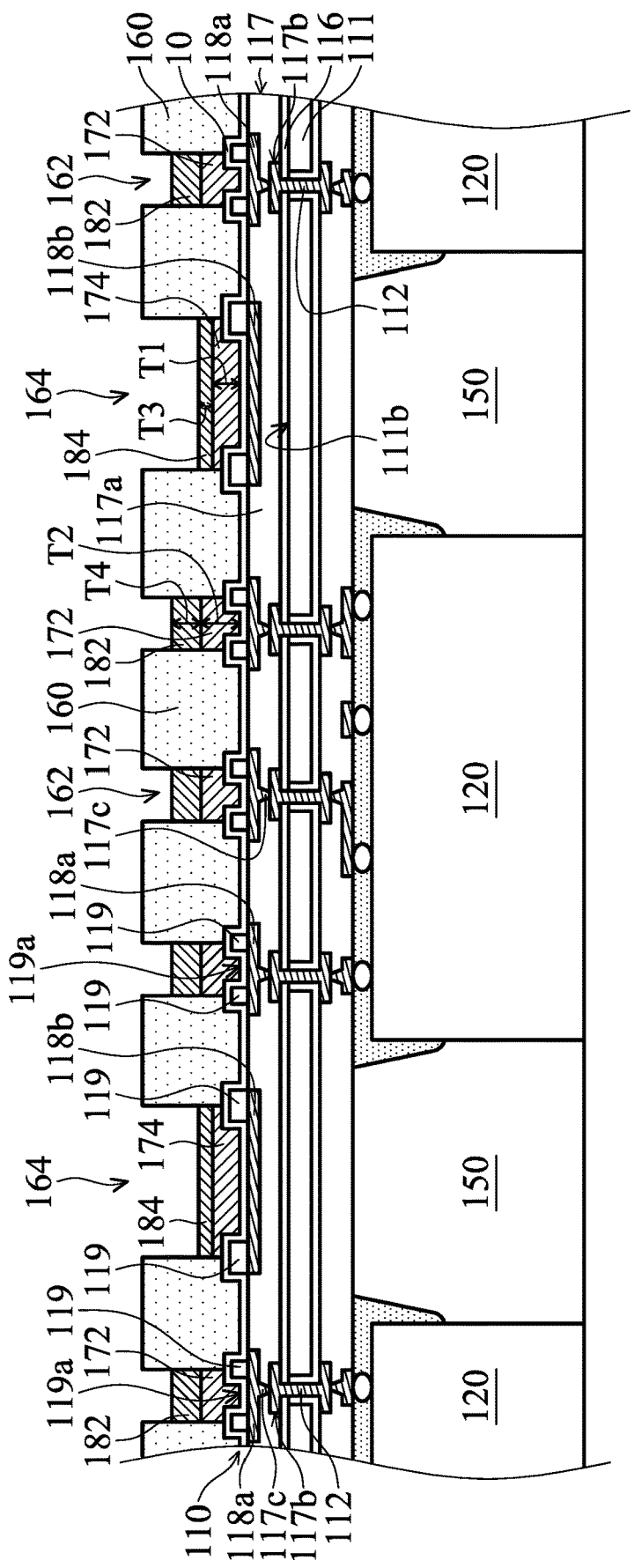

As shown in FIG. 1C, the semiconductor structure 111 is flipped upside down, in accordance with some embodiments. As shown in FIG. 1C, an insulating layer 116 is formed over the surface 111b, in accordance with some embodiments. The insulating layer 116 is configured to electrically insulate wiring layers subsequently formed thereon from the semiconductor structure 111, in accordance with some embodiments. The insulating layer 116 is made of an oxide-containing material such as silicon oxide, in accordance with some embodiments. The insulating layer 116 is formed using an oxidation process, a deposition process, or another suitable process.

In some embodiments, a redistribution structure 117 is formed over the surface 111b of the semiconductor structure 111, in accordance with some embodiments. The redistribution structure 117 includes a dielectric layer 117a, wiring layers 117b, and conductive vias 117c, in accordance with some embodiments. The wiring layers 117b are formed in the dielectric layer 117a, in accordance with some embodiments.

As shown in FIG. 1C, conductive pads 118a and 118b are formed over the redistribution structure 117, in accordance with some embodiments. The conductive vias 117c are electrically connected between different wiring layers 117b and between the wiring layer 117b and the conductive pads 118a, in accordance with some embodiments. For the sake of simplicity, FIG. 1C only shows one of the wiring layers 117b, in accordance with some embodiments. The conductive vias 112 are electrically connected to the conductive pads 118a through the wiring layers 117b and the conductive vias 117c, in accordance with some embodiments.

As shown in FIG. 1C, buffer rings 119 are formed over the conductive pads 118a and 118b, in accordance with some embodiments. The buffer ring 119 has an opening 119a exposing the conductive pad 118a or 118b thereunder, in accordance with some embodiments. The buffer rings 119 are configured to buffer the stress between the substrate 110 and bumps subsequently formed thereover, in accordance with some embodiments.

The buffer rings 119 are made of an elastic material such as a polymer material (e.g., polyimide), in accordance with some embodiments. In some other embodiments (not shown), the buffer rings 119 are replaced with a buffer layer having openings exposing the conductive pads 118a and 118b.

As shown in FIG. 1C, a seed layer 10 is formed over the redistribution structure 117, the buffer rings 119, and the conductive pads 118a and 118b, in accordance with some embodiments. The materials of the seed layer 10 may include copper or copper alloys. The materials of the seed layer 10 may include other metals, such as silver, gold, aluminum, and combinations thereof.

As shown in FIG. 1C, a mask layer 160 is formed over the seed layer 10, in accordance with some embodiments. The mask layer 160 has openings 162 and 164 exposing the seed layer 10 over the conductive pads 118a and 118b and the buffer rings 119 adjacent to the conductive pads 118a and 118b, in accordance with some embodiments. The mask layer 160 is made of a polymer material such as a photoresist material, in accordance with some embodiments.

As shown in FIG. 1C, bumps 172 and dummy bumps 174 are respectively formed in the openings 162 and 164 and over the conductive pads 118a and 118b, in accordance with some embodiments. In some embodiments, the bumps 172 are electrically connected to the chip structures 120 through the substrate 110. In some embodiments, the dummy bumps 174 are electrically insulated from the chip structures 120.

The dummy bump 174 is thinner than the bump 172, in accordance with some embodiments. That is, a thickness T1 of the dummy bump 174 is less than a thickness T2 of the bump 172, in accordance with some embodiments.

The bumps 172 and the dummy bumps 174 are made of a conductive material such as copper (Cu), aluminum (Al), tungsten (W), cobalt (Co), or nickel (Ni), in accordance with some embodiments. The bumps 172 and the dummy bumps 174 are formed using a plating process such as an electroplating process, in accordance with some embodiments.

As shown in FIG. 1C, a solder layer 182 and a dummy solder layer 184 are respectively formed over the bumps 172 and the dummy bumps 174, in accordance with some embodiments. The dummy solder layer 184 is thinner than the solder layer 182, in accordance with some embodiments. That is, a thickness T3 of the dummy solder layer 184 is less than a thickness T4 of the solder layer 182, in accordance with some embodiments.

The solder layer 182 and the dummy solder layer 184 is made of tin (Sn) or another suitable conductive material with a melting point lower than that of the bumps 172 and the dummy bumps 174, in accordance with some embodiments. The solder layer 182 and the dummy solder layer 184 are formed using a plating process such as an electroplating process, in accordance with some embodiments.

Figure 1D:
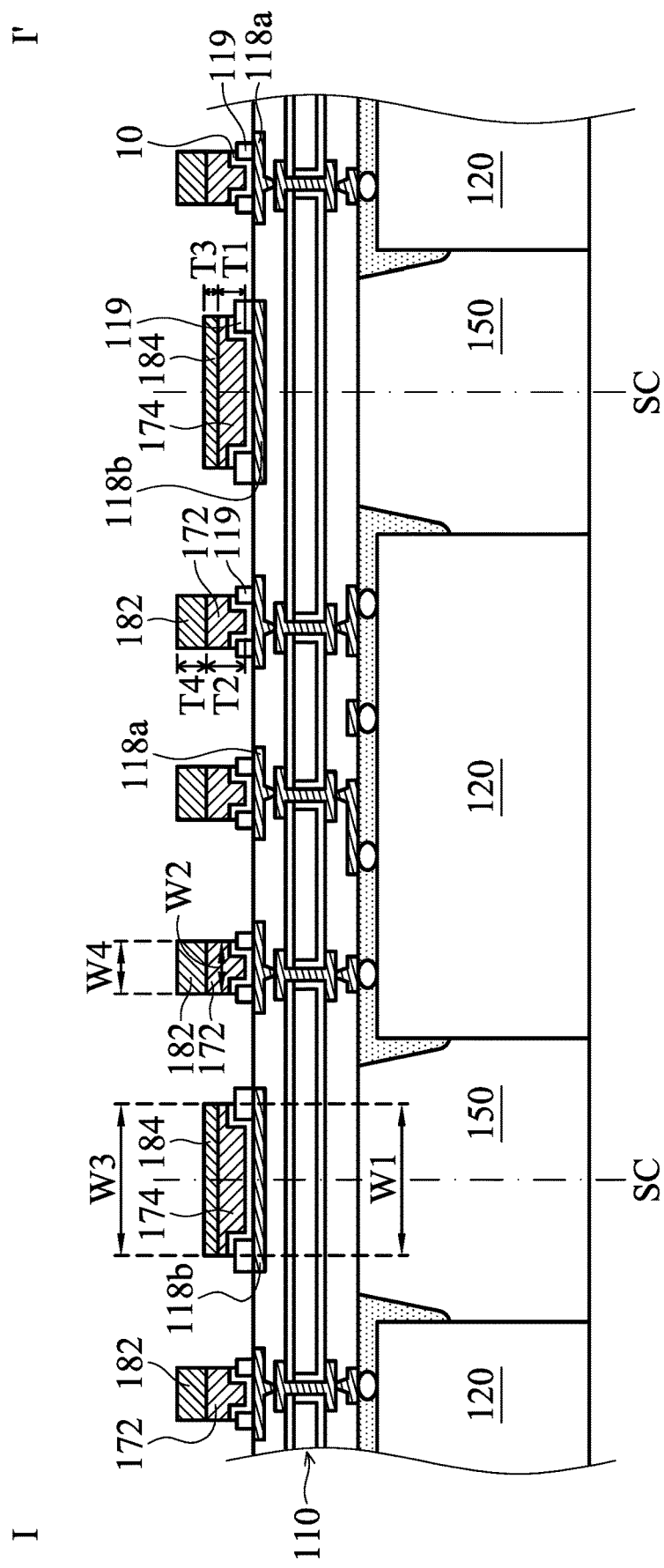
Figures 1, 1D:
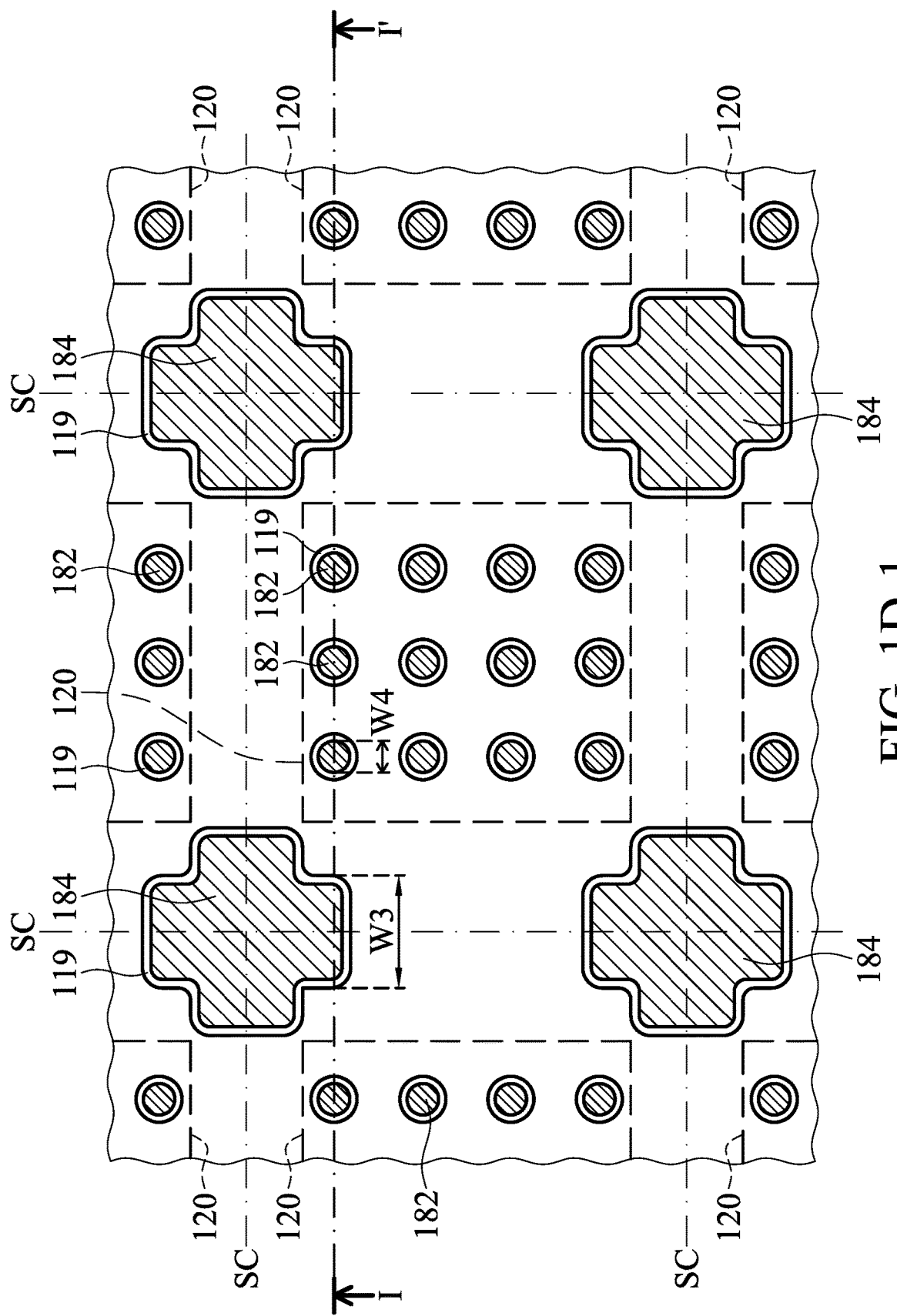

FIG. 1D-1 is a top view of the chip package structure of FIG. 1D, in accordance with some embodiments. FIG. 1D is a cross-sectional view illustrating the chip package structure along a sectional line I-I' in FIG. 1D-1, in accordance with some embodiments. As shown in FIGS. 1D and 1D-1, the mask layer 160 is removed, in accordance with some embodiments.

As shown in FIGS. 1D and 1D-1, the seed layer 10 originally covered by the mask layer 160 is removed, in accordance with some embodiments. The seed layer 10 is removed using an etching process, in accordance with some embodiments. The width W1 of the dummy bump 174 is greater than the width W2 of the bump 172, in accordance with some embodiments. The width W3 of the dummy solder layer 184 is greater than the width W4 of the solder layer 182, in accordance with some embodiments.

Figure 1E:
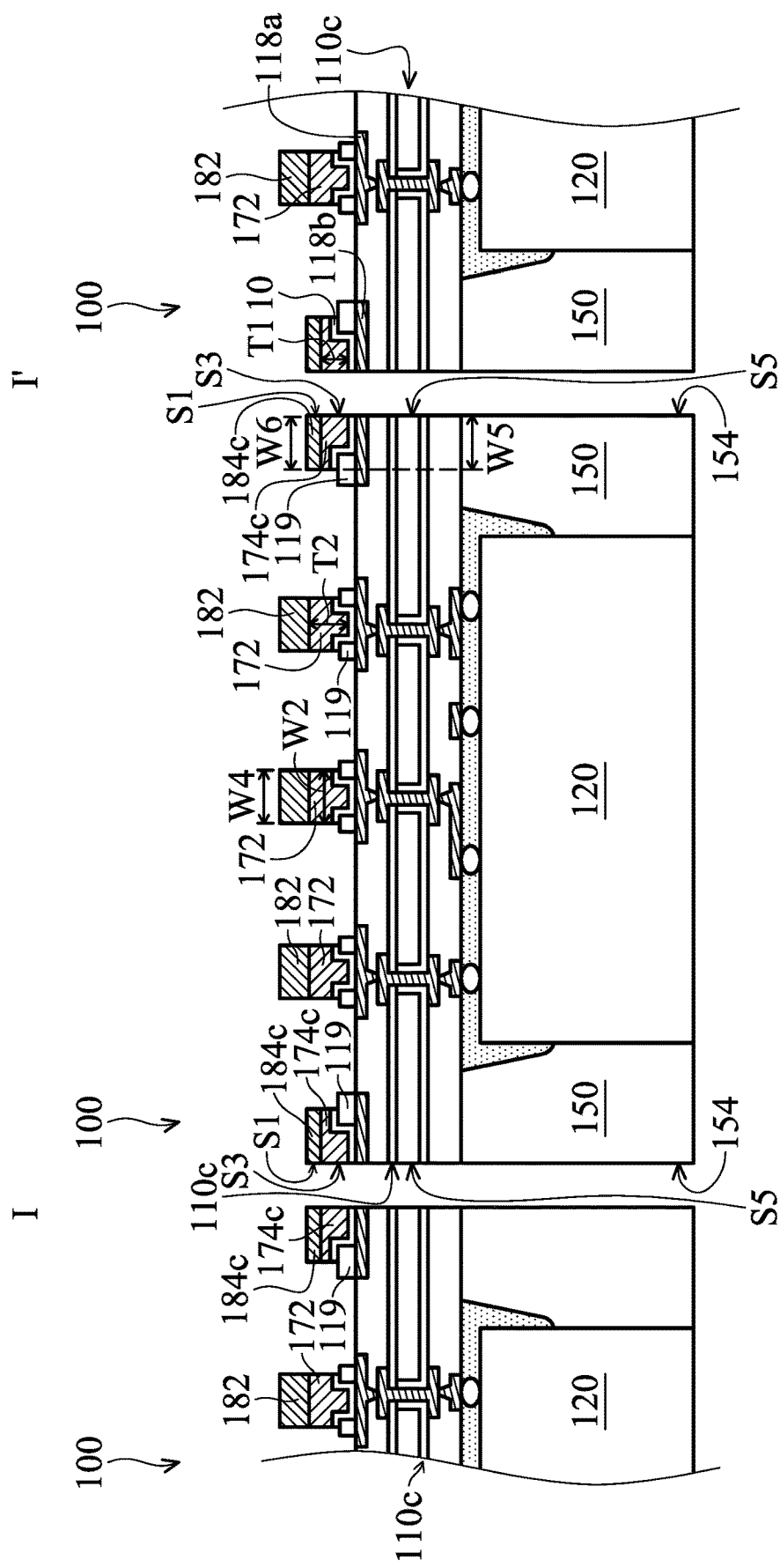
Figures 1, 1E:
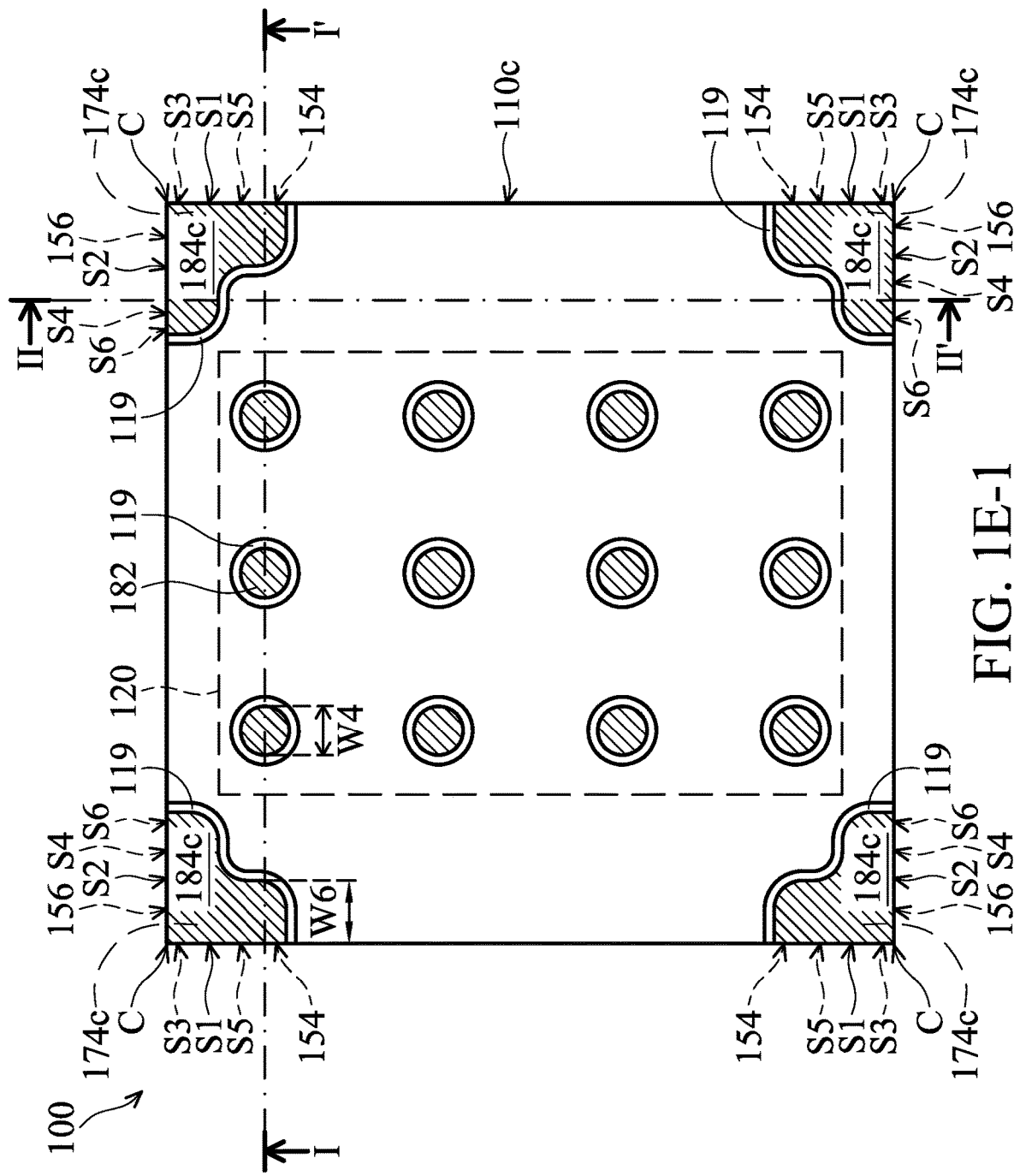

As shown in FIGS. 1D and 1E, a cutting process is performed to cut through the molding layer 150, the substrate 110, the conductive pads 118b, the buffer rings 119, the seed layer 10, the dummy bumps 174, and the dummy solder layer 184 along predetermined scribe lines SC to form chip package structures 100, in accordance with some embodiments.

After the cutting process, the substrate 110, the dummy bumps 174, and the dummy solder layer 184 are cut to form cut substrates 110c, cut dummy bumps 174c, and cut dummy solder layer 184c, in accordance with some embodiments. In some embodiments, the cut substrate 110c, the cut dummy bump 174c, and the cut dummy solder layer 184c are also referred to as a substrate, a dummy bump, and a dummy solder layer.

Figures 1, 1E, 2:
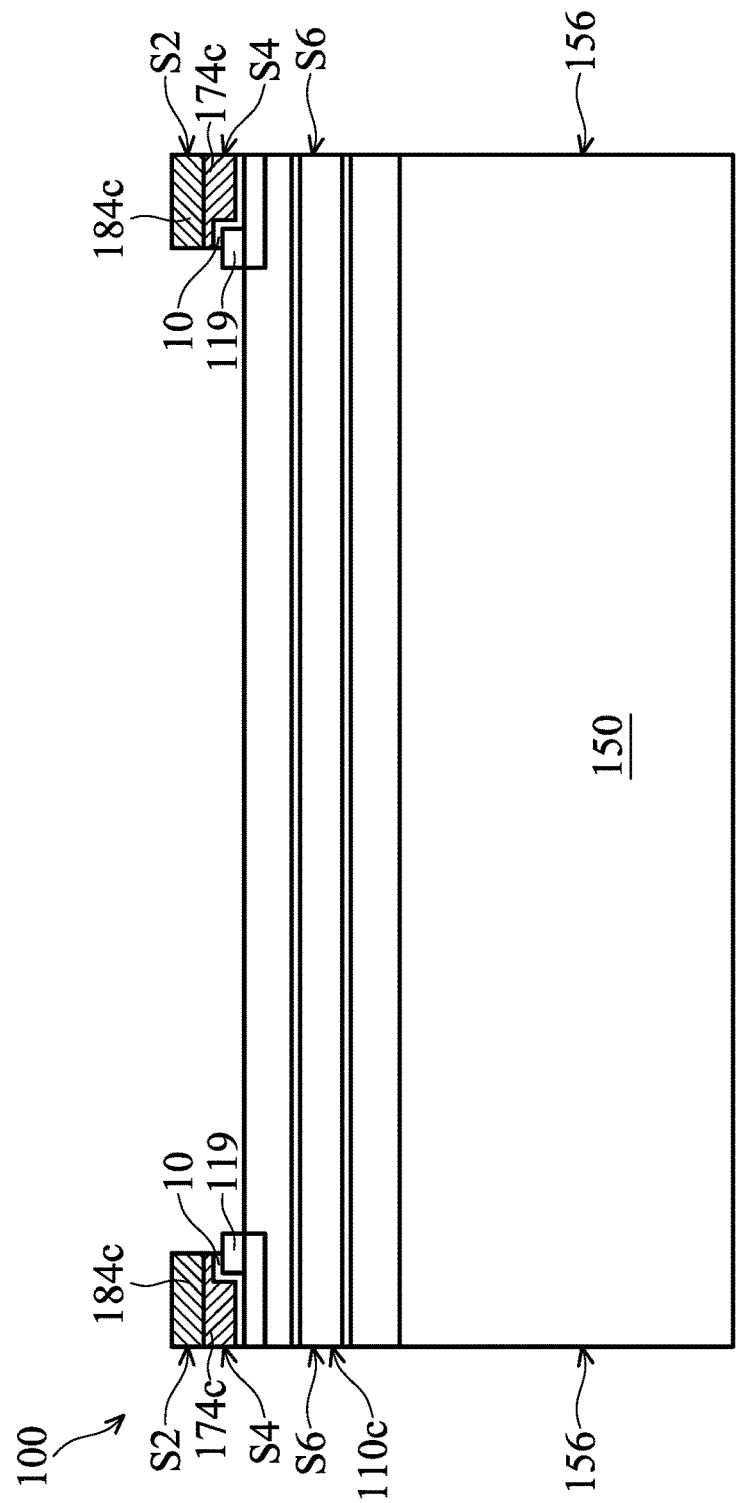

FIG. 1E-1 is a top view of one of the chip package structures 100 of FIG. 1E, in accordance with some embodiments. FIG. 1E is a cross-sectional view illustrating the chip package structure 100 along a sectional line I-I' in FIG. 1E-1, in accordance with some embodiments. FIG. 1E-2 is a cross-sectional view illustrating the chip package structure 100 along a sectional line II-II' in FIG. 1E-1, in accordance with some embodiments.

As shown in FIGS. 1E and 1E-1, each cut dummy bump 174c and each cut dummy solder layer 184c are over one of corner portions C of the cut substrate 110c, in accordance with some embodiments. As shown in FIGS. 1E and 1E-1, the cut dummy solder layer 184c has two adjacent sidewalls S1 and S2, in accordance with some embodiments. The cut dummy bump 174c has two adjacent sidewalls S3 and S4, in accordance with some embodiments. The cut substrate 110c has two adjacent sidewalls S5 and S6, in accordance with some embodiments. The molding layer 150 has two adjacent sidewalls 154 and 156, in accordance with some embodiments.

As shown in FIGS. 1E and 1E-1, the sidewalls S1, S3, S5 and 154 are substantially coplanar, in accordance with some embodiments. The term "substantially coplanar" in the application may include small deviations from coplanar geometries.

The deviations may be due to manufacturing processes. As shown in FIGS. 1E-1 and 1E-2, the sidewalls S2, S4, S6 and 156 are substantially coplanar, in accordance with some embodiments.

As shown in FIGS. 1E and 1E-1, the width W5 of the cut dummy bump 174c is greater than the width W2 of the bump 172, in accordance with some embodiments. The width W6 of the cut dummy solder layer 184c is greater than the width W4 of the solder layer 182, in accordance with some embodiments.

In some other embodiments, the width W5 of the cut dummy bump 174c is equal to or less than the width W2 of the bump 172, in accordance with some embodiments. The width W6 of the cut dummy solder layer 184c is equal to or less than the width W4 of the solder layer 182, in accordance with some embodiments.

Figure 1F:
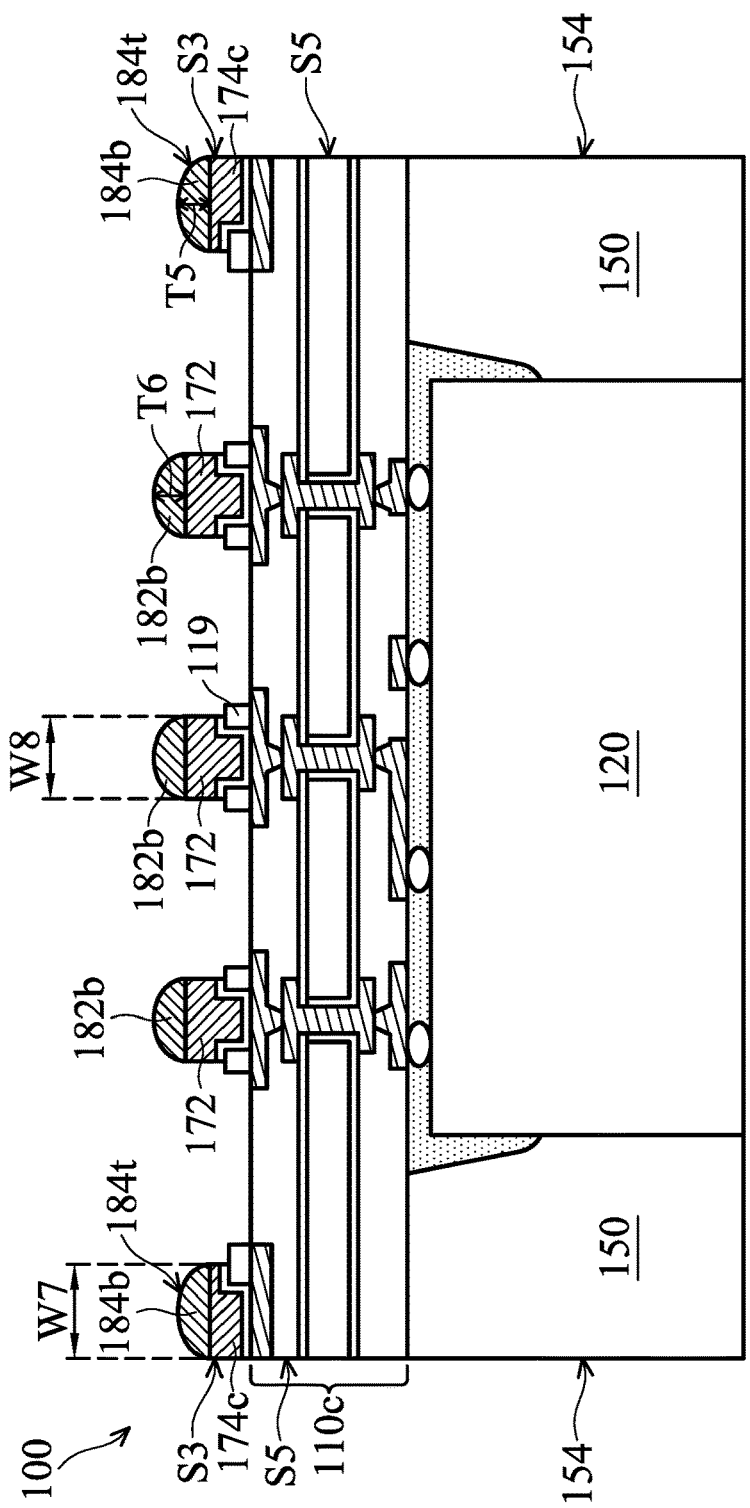
Figures 1, 1F:
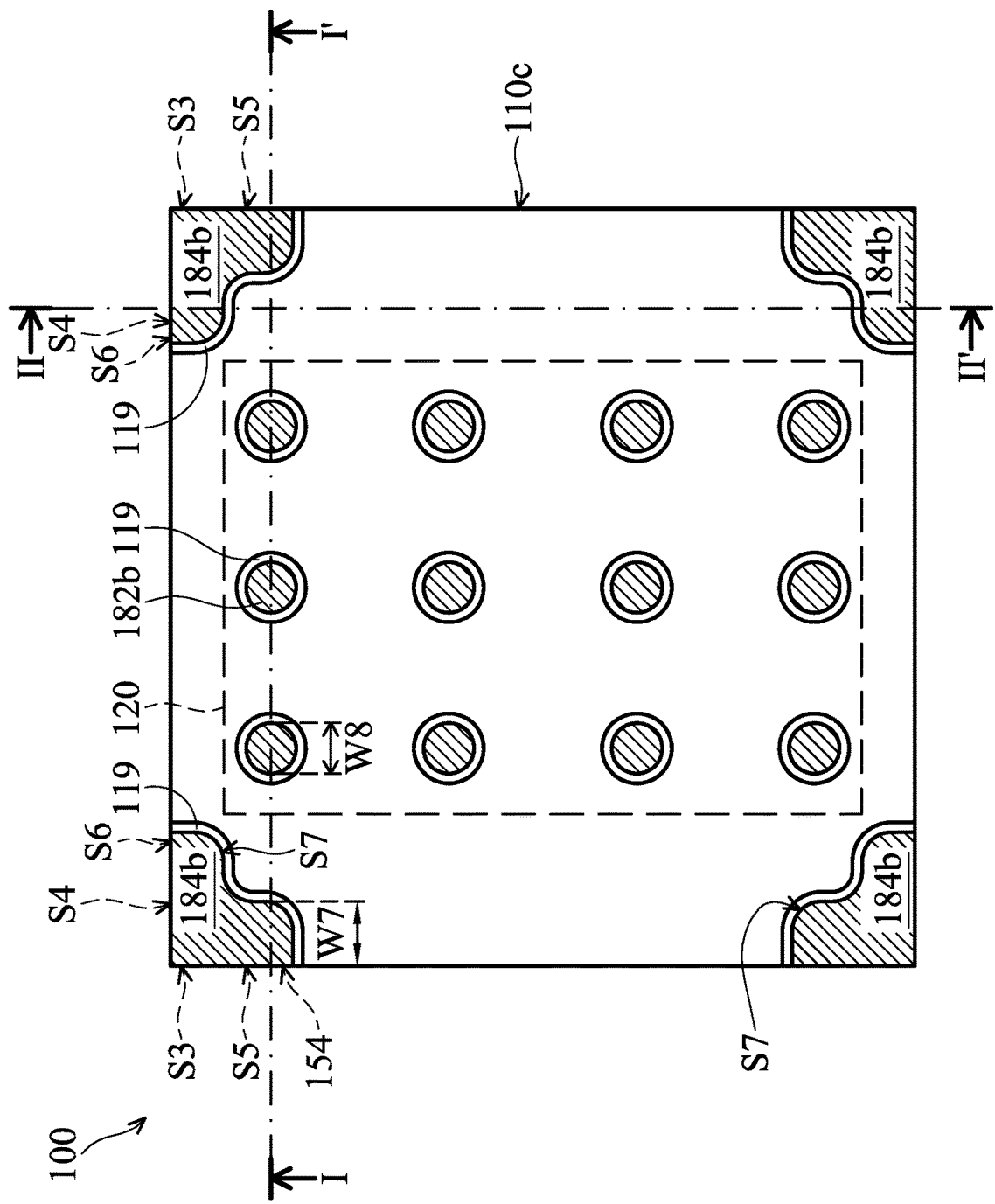
Figures 1, 1F, 2:
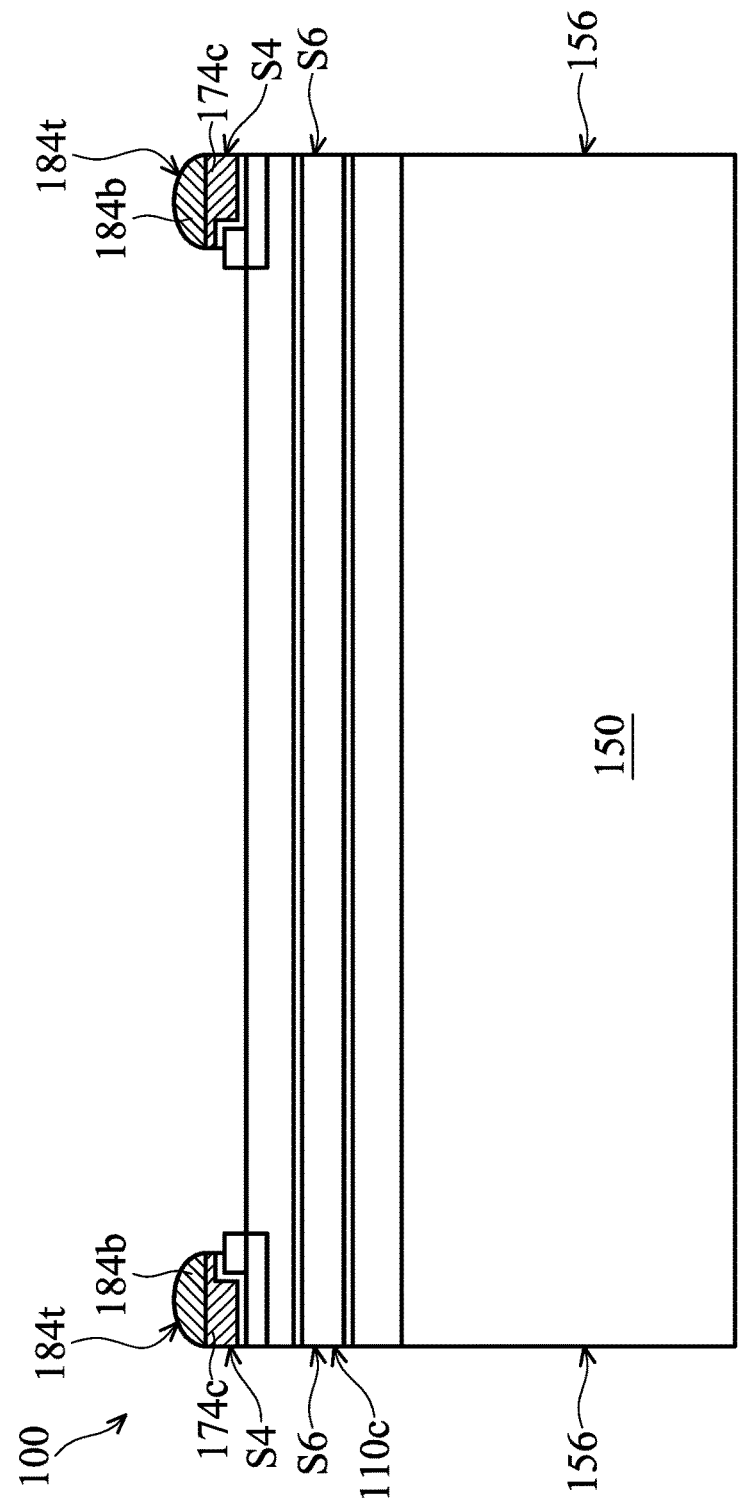

FIG. 1F-1 is a top view of the chip package structure of FIG. 1F, in accordance with some embodiments. As shown in FIGS. 1E, 1F and 1F-1, a reflow process is performed over the solder layer 182 and the cut dummy solder layer 184c to convert the solder layer 182 and the cut dummy solder layer 184c into solder balls 182b and dummy solder balls 184b, in accordance with some embodiments. The dummy solder ball 184b is thinner than the solder ball 182b, in accordance with some embodiments. That is, the thickness T5 of the dummy solder ball 184b is less than the thickness T6 of the solder ball 182b, in accordance with some embodiments.

As shown in FIG. 1F-1, the dummy solder ball 184b has an L-like shape, in accordance with some embodiments. As shown in FIG. 1F-1, the dummy solder ball 184b has a curved sidewall S7, in accordance with some embodiments. FIG. 1F-2 is a cross-sectional view illustrating the chip package structure 100 along a sectional line II-II' in FIG. 1F-1, in accordance with some embodiments.

As shown in FIGS. 1F and 1F-2, the dummy solder ball 184b has a substantially semi-circle shape, in accordance with some embodiments. The dummy solder ball 184b has a curved top surface 184t, in accordance with some embodiments. The dummy solder balls 184b with the curved top surfaces 184t round the corner portions of the chip package structure 100, in accordance with some embodiments. Therefore, the dummy solder balls 184b prevent or reduce the formation of cracks in the underfill layer subsequently formed around the chip package structure 100, which would otherwise be the result of a chip package structure with sharp corner portions, in accordance with some embodiments. Therefore, the formation of the dummy solder balls 184b improves the yield of the underfill layer.

As shown in FIGS. 1F and 1F-1, the width W7 of the dummy solder ball 184b is greater than the width W8 of the solder ball 182b, in accordance with some embodiments. In some other embodiments, the width W7 of the dummy solder ball 184b is equal to or less than the width W8 of the solder ball 182b.

Figure 1G:
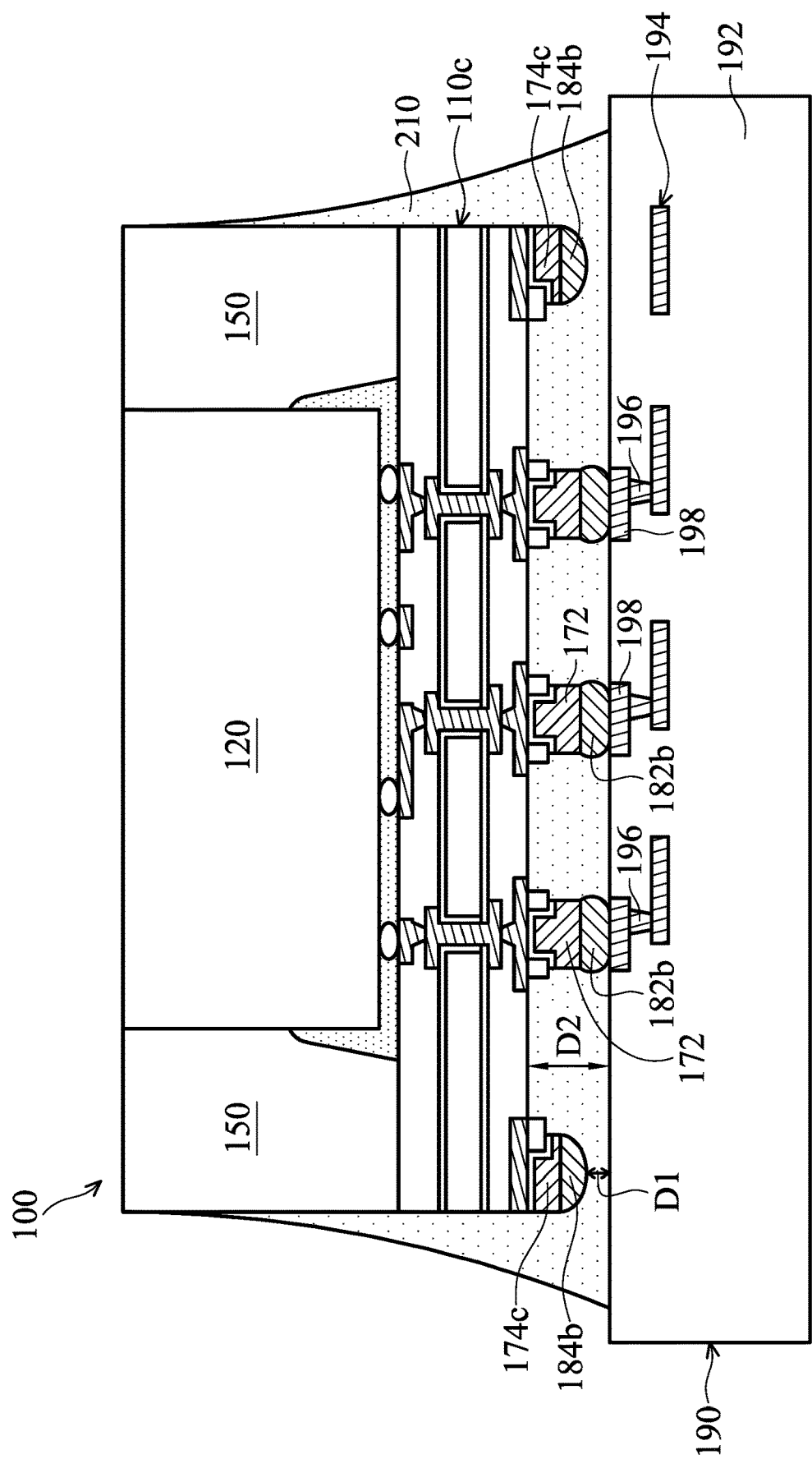
Figure 2:
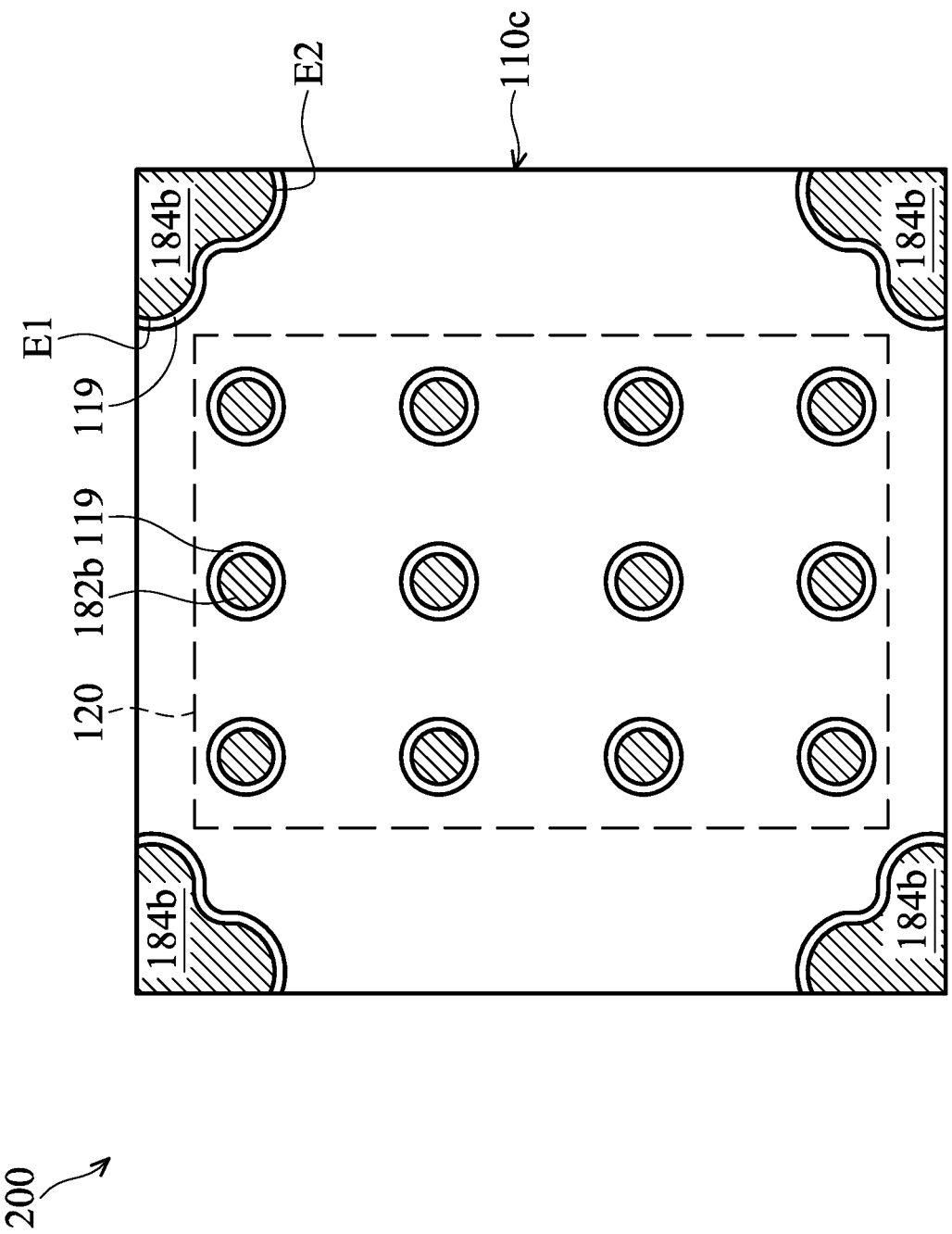

As shown in FIG. 1G, the chip package structure 100 is flipped upside down, in accordance with some embodiments. As shown in FIG. 1G, the chip package structure 100 is bonded to a substrate 190 through the solder balls 182b, in accordance with some embodiments. The dummy solder balls 184b are spaced apart from the substrate 190, in accordance with some embodiments. The dummy solder balls 184b are electrically insulated from the substrate 190, in accordance with some embodiments.

There is a distance D1 between the dummy solder ball 184b and the substrate 190, in accordance with some embodiments. There is a distance D2 between the cut substrate 110c and the substrate 190, in accordance with some embodiments. In some embodiments, a ratio of the distance D1 to the distance D2 ranges from about 0.3 to about 0.7. If the ratio of the distance D1 to the distance D2 is less than 0.3, the dummy solder ball 184b may retard the formation of an underfill layer subsequently formed between the cut substrate 110c and the substrate 190, in accordance with some embodiments.

The substrate 190 includes a dielectric layer 192, wiring layers 194, conductive vias 196, and pads 198, in accordance with some embodiments. The wiring layers 194 and the conductive pads 198 are formed in the dielectric layer 192, in accordance with some embodiments. The conductive vias 196 are electrically connected between different wiring layers 194 and between the wiring layer 194 and the conductive pads 198, in accordance with some embodiments. For the sake of simplicity, FIG. 1G only shows one of the wiring layers 194, in accordance with some embodiments.

As shown in FIG. 1G, an underfill layer 210 is formed between the cut substrate 110c and the substrate 190, in accordance with some embodiments. In some embodiments, a portion of the underfill layer 210 is formed over the substrate 190 and surrounds the chip package structure 100. The underfill layer 210 is made of an insulating material, such as a polymer material, in accordance with some embodiments.

FIG. 2 is a top view of a chip package structure 200, in accordance with some embodiments. As shown in FIG. 2, the chip package structure 200 is similar to the chip package structure 100 of FIG. 1F-1, except that the dummy solder ball 184b of the chip package structure 200 has rounded ends E1 and E2, in accordance with some embodiments.

Figure 3A:
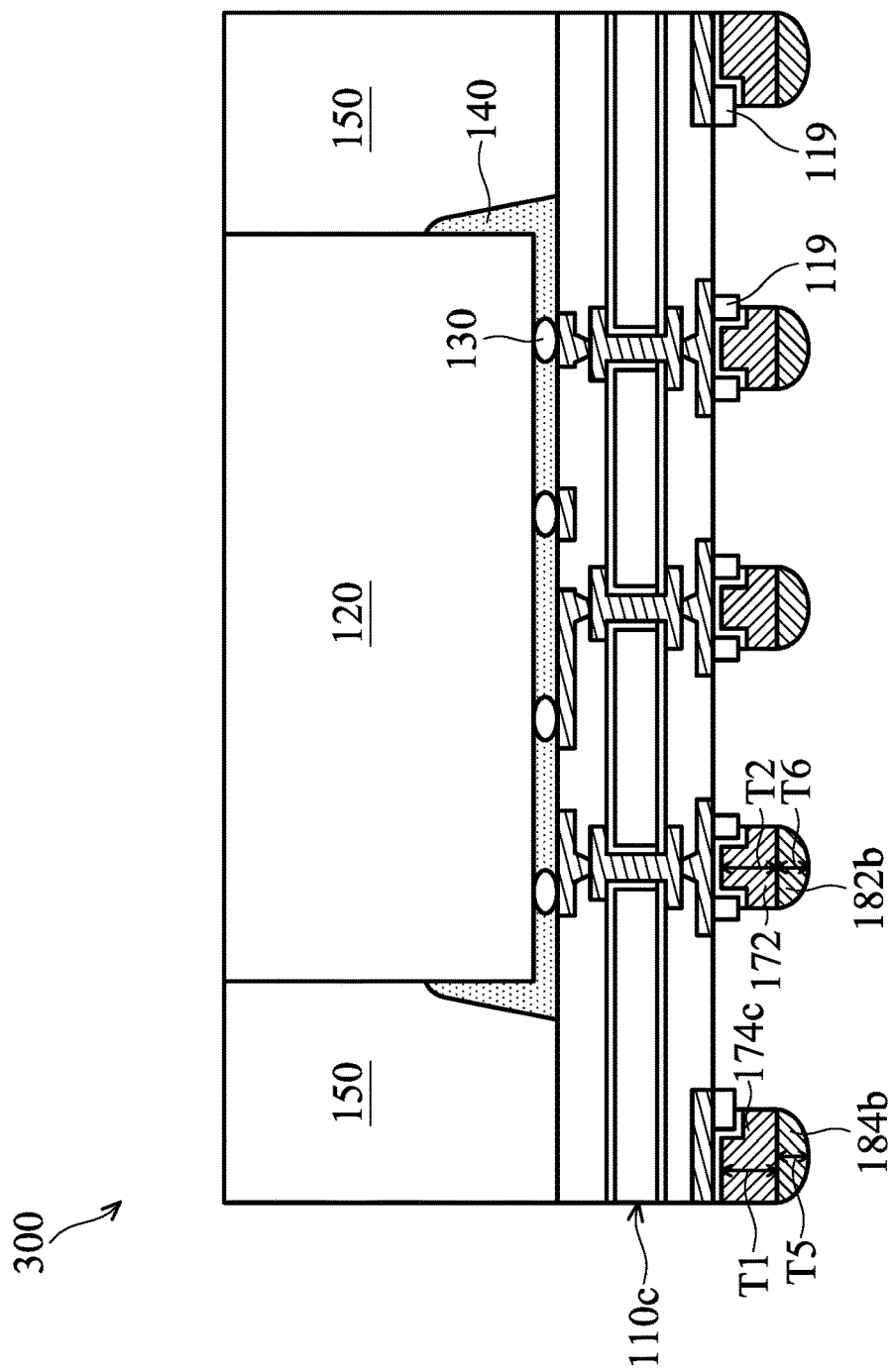
FIGS. 3A-3B are cross-sectional views of various stages of a process for forming a chip package structure, in accordance with some embodiments.
Figures 1, 3A:
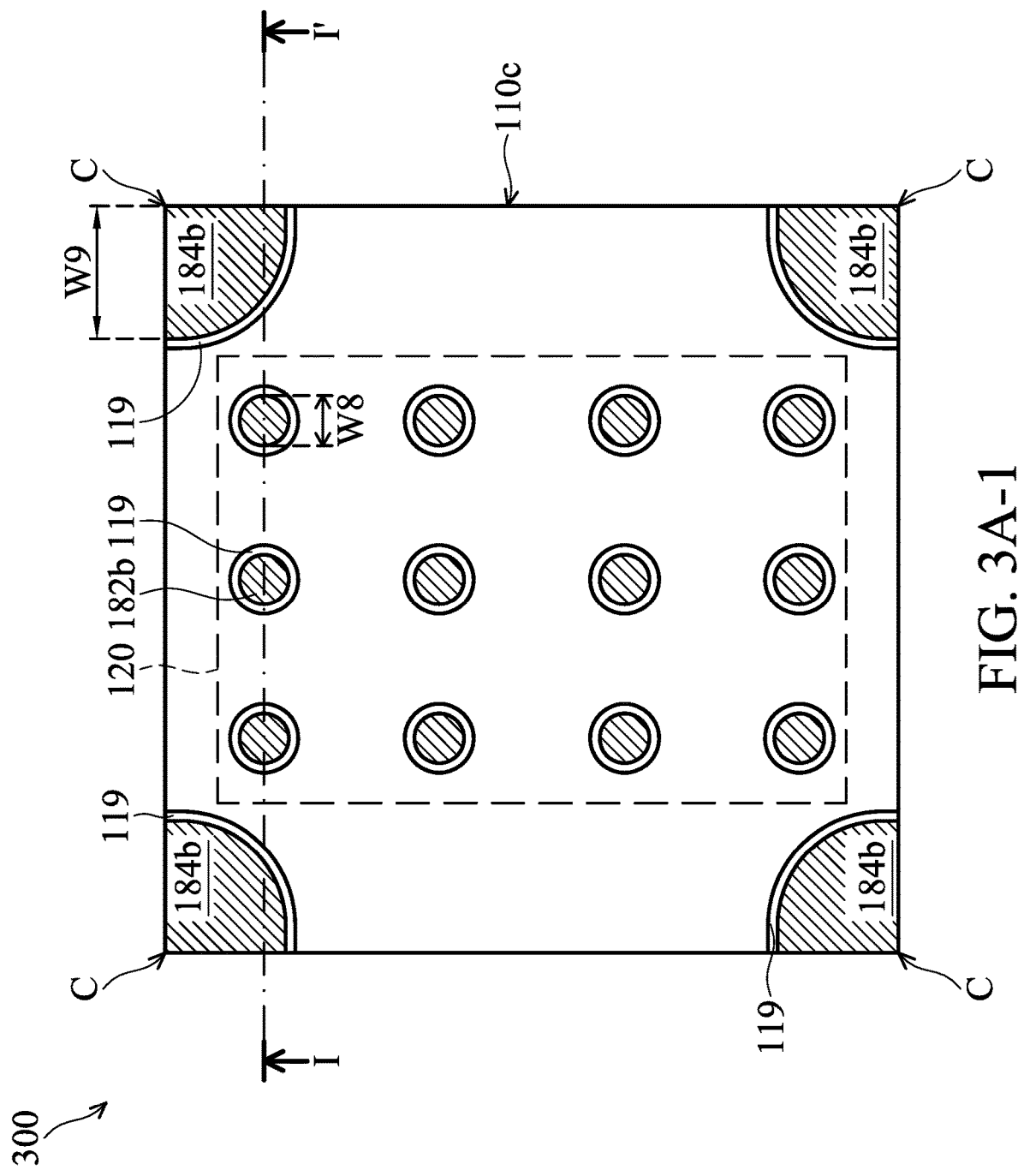
Figure 3B:
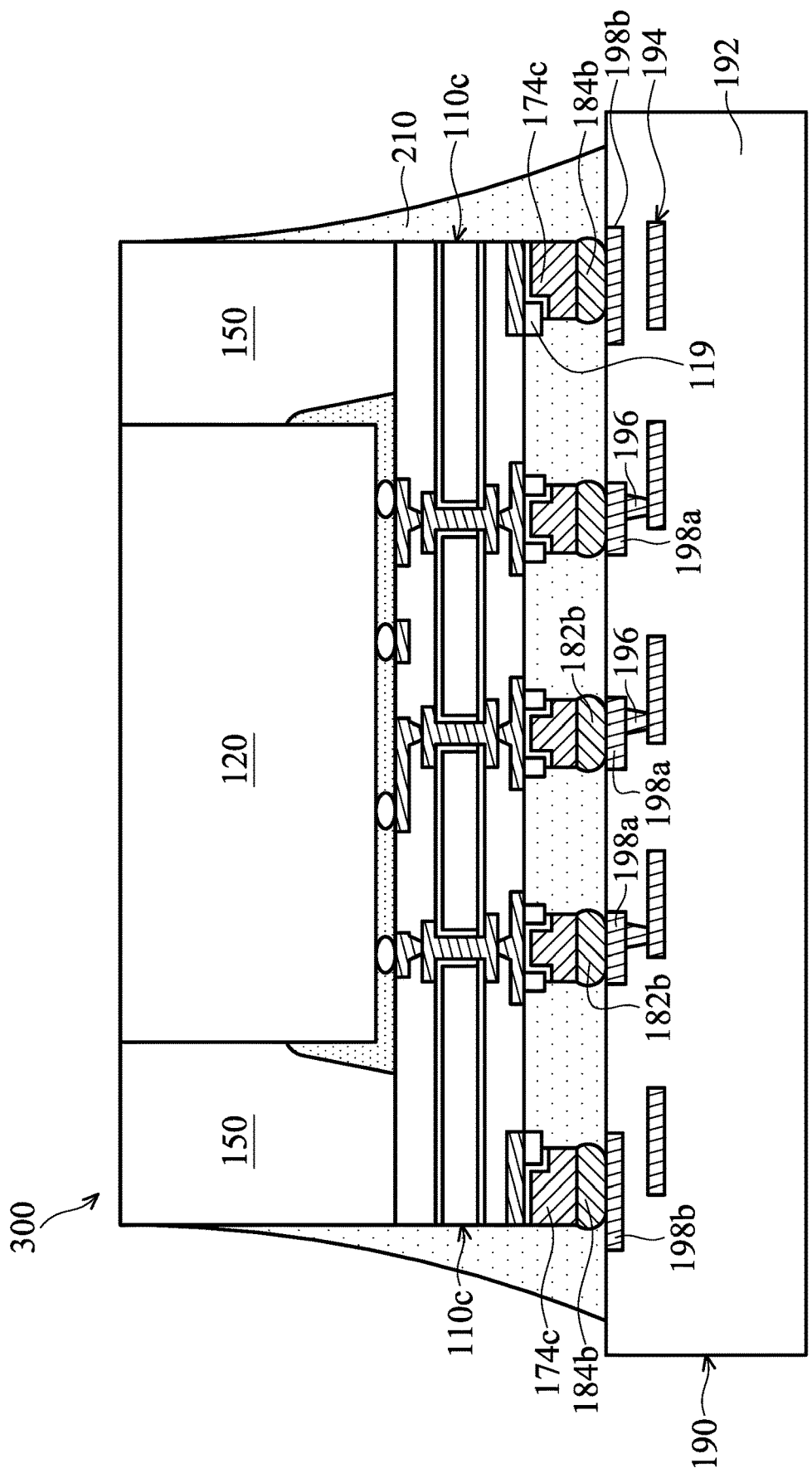

FIGS. 3A-3B are cross-sectional views of various stages of a process for forming a chip package structure, in accordance with some embodiments. FIG. 3A-1 is a bottom view of the chip package structure of FIG. 3A, in accordance with some embodiments. FIG. 3A is a cross-sectional view illustrating the chip package structure along a sectional line I-I' in FIG. 3A-1, in accordance with some embodiments. As shown in FIGS. 3A and 3A-1, a chip package structure 300 is provided, in accordance with some embodiments.

The chip package structure 300 is similar to the chip package structure 100 of FIG. 1F, except that the thickness T1 of the cut dummy bump 174c is substantially equal to the thickness T2 of the bump 172, and the thickness T5 of the dummy solder ball 184b is substantially equal to the thickness T6 of the solder ball 182b, in accordance with some embodiments.

The term "substantially equal to" in the application means "within 10%", in accordance with some embodiments. For example, the term "substantially equal to" means the difference between the thicknesses T1 and T2 is within 10% of the average thickness between the cut dummy bump 174c and the bump 172, in accordance with some embodiments. The difference may be due to manufacturing processes. As shown in FIG. 3A-1, the dummy solder balls 184b have a substantially quarter-circle shape, in accordance with some embodiments.

As shown in FIG. 3A-1, a width W9 of the dummy solder ball 184b is greater than the width W8 of the solder ball 182b, in accordance with some embodiments. In some other embodiments, the width W9 of the dummy solder ball 184b is equal to or less than the width W8 of the solder ball 182b.

As shown in FIG. 3B, the chip package structure 300 is bonded to a substrate 190 through the solder balls 182b and the dummy solder balls 184b, in accordance with some embodiments. Since the stress between the cut substrate 110c and the substrate 190 tends to concentrate on the dummy solder balls 184b over the corner portions C of the cut substrate 110c, the dummy solder balls 184b bear most of the stress between the cut substrate 110c and the substrate 190, in accordance with some embodiments. Therefore, the dummy solder balls 184b reduce the stress on the solder balls 182b, in accordance with some embodiments. The yield of the solder balls 182b is improved, in accordance with some embodiments.

The substrate 190 includes a dielectric layer 192, wiring layers 194, conductive vias 196, and pads 198a and 198b, in accordance with some embodiments. The wiring layers 194 and the conductive pads 198a and 198b are formed in the dielectric layer 192, in accordance with some embodiments. The conductive vias 196 are electrically connected between different wiring layers 194 and between the wiring layer 194 and the conductive pads 198a, in accordance with some embodiments. For the sake of simplicity, FIG. 3B only shows one of the wiring layers 194, in accordance with some embodiments.

As shown in FIG. 3B, an underfill layer 210 is formed between the cut substrate 110c and the substrate 190, in accordance with some embodiments. In some embodiments, a portion of the underfill layer 210 is formed over the substrate 190 and surrounds the chip package structure 300. The underfill layer 210 is made of an insulating material, such as a polymer material, in accordance with some embodiments.

Processes and materials for forming the chip package structures 200 and 300 may be similar to, or the same as, those for forming the chip package structure 100 described above.

In accordance with some embodiments, chip package structures and methods for forming the same are provided. The methods (for forming the chip package structure) form dummy solder balls over corner portions of a substrate to round corner portions of the chip package structure so as to prevent or reduce the formation of cracks in an underfill layer subsequently formed around the chip package structure, which would otherwise be the result of a chip package structure with sharp corner portions. Therefore, the formation of the dummy solder balls improves the yield of the underfill layer.

In accordance with some embodiments, a method for forming a chip package structure is provided. The method includes bonding a chip to a first surface of a first substrate. The method includes forming a dummy bump over a second surface of the first substrate. The first surface is opposite the second surface, and the dummy bump is electrically insulated from the chip. The method includes cutting through the first substrate and the dummy bump to form a cut substrate and a cut dummy bump. The cut dummy bump is over a corner portion of the cut substrate, a first sidewall of the cut dummy bump is substantially coplanar with a second sidewall of the cut substrate, and a third sidewall of the cut dummy bump is substantially coplanar with a fourth sidewall of the cut substrate.

In accordance with some embodiments, a method for forming a chip package structure is provided. The method includes bonding a chip to a first surface of a first substrate. The method includes forming a bump and a dummy bump over a second surface of the first substrate. The first surface is opposite the second surface, the bump is electrically connected to the chip, and the dummy bump is electrically insulated from the chip. The method includes cutting through the first substrate and the dummy bump to form a cut substrate and a cut dummy bump. The cut dummy bump is over a corner portion of the cut substrate, and a first sidewall of the cut dummy bump is substantially coplanar with a second sidewall of the cut substrate. The method includes bonding the cut substrate to a second substrate through the bump and the dummy bump.

In accordance with some embodiments, a chip package structure is provided. The chip package structure includes a first substrate having a first surface and a second surface opposite the first surface. The chip package structure includes a chip over the first surface. The chip package structure includes a dummy bump over the second surface. The dummy bump is electrically insulated from the chip, the dummy bump is over a corner portion of the first substrate, a first sidewall of the dummy bump is substantially coplanar with a second sidewall of the first substrate, and a third sidewall of the dummy bump is substantially coplanar with a fourth sidewall of the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
    bonding a chip to a first surface of a first substrate;
    forming a dummy bump over a second surface of the first substrate, wherein the first surface is opposite the second surface, and the dummy bump is electrically insulated from the chip; and
    cutting through the first substrate and the dummy bump to form a cut substrate and a cut dummy bump, wherein the cut dummy bump is over a corner portion of the cut substrate, a first sidewall of the cut dummy bump is substantially coplanar with a second sidewall of the cut substrate, and a third sidewall of the cut dummy bump is substantially coplanar with a fourth sidewall of the cut substrate.

2. The method for forming the chip package structure as claimed in claim 1, wherein the first sidewall is adjacent to the third sidewall, and the second sidewall is adjacent to the fourth sidewall.

3. The method for forming the chip package structure as claimed in claim 1, further comprising:

forming a dummy solder layer over the dummy bump before cutting through the first substrate and the dummy bump, wherein the cutting through of the first substrate and the dummy bump further comprises cutting through the dummy solder layer to form a cut dummy solder layer.

4. The method for forming the chip package structure as claimed in claim 3, further comprising:

reflowing the cut dummy solder layer to form a dummy solder ball.

5. The method for forming the chip package structure as claimed in claim 4, wherein the dummy solder ball has an L-like shape or a substantially quarter-circle shape in a top view of the dummy solder ball.

6. The method for forming the chip package structure as claimed in claim 1, further comprising:

forming a bump over the second surface of the first substrate during forming the dummy bump over the second surface, wherein the bump is electrically connected to the chip.

7. The method for forming the chip package structure as claimed in claim 6, wherein the dummy bump is thinner than the bump.

8. The method for forming the chip package structure as claimed in claim 6, further comprising:

forming a solder layer and a dummy solder layer respectively over the bump and the dummy bump before cutting through the first substrate and the dummy bump, wherein the dummy solder layer is thinner than the solder layer, and the cutting through of the first substrate and the dummy bump further comprises cutting through the dummy solder layer to form a cut dummy solder layer.

9. The method for forming the chip package structure as claimed in claim 8, further comprising:

reflowing the solder layer and the cut dummy solder layer to respectively form a solder ball and a dummy solder ball after cutting through the first substrate, the dummy bump, and the dummy solder layer, wherein the dummy solder ball is thinner than the solder ball.

10. The method for forming the chip package structure as claimed in claim 9, further comprising:

bonding the cut substrate to a second substrate through the solder ball.

11. The method for forming the chip package structure as claimed in claim 10, wherein the dummy solder ball is spaced apart from the second substrate, and the dummy solder ball is electrically insulated from the second substrate.

12. A method for forming a chip package structure, comprising:

bonding a chip to a first surface of a first substrate;

forming a bump and a dummy bump over a second surface of the first substrate, wherein the first surface is opposite the second surface, the bump is electrically connected to the chip, and the dummy bump is electrically insulated from the chip;

cutting through the first substrate and the dummy bump to form a cut substrate and a cut dummy bump, wherein the cut dummy bump is over a corner portion of the cut substrate, and a first sidewall of the cut dummy bump is substantially coplanar with a second sidewall of the cut substrate; and bonding the cut substrate to a second substrate through the bump and the dummy bump.

13. The method for forming the chip package structure as claimed in claim 12, wherein a third sidewall of the cut dummy bump is substantially coplanar with a fourth sidewall of the cut substrate.

14. The method for forming the chip package structure as claimed in claim 12, further comprising:

forming a solder layer and a dummy solder layer respectively over the bump and the dummy bump before cutting through the first substrate and the dummy bump, wherein the cutting through of the first substrate and the dummy bump further comprises cutting through the dummy solder layer to form a cut dummy solder layer.

15. The method for forming the chip package structure as claimed in claim 14, further comprising:

reflowing the solder layer and the cut dummy solder layer to respectively form a solder ball and a dummy solder ball after cutting through the first substrate, the dummy bump, and the dummy solder layer.

16. A method for forming a chip package structure, comprising:

bonding a chip to a first surface of a first substrate;

forming a dummy bump over a second surface of the first substrate, wherein the first surface is opposite the second surface, and the dummy bump is electrically insulated from the chip;

forming a dummy solder layer over the dummy bump;

cutting through the first substrate, the dummy bump, and the dummy solder layer to form a cut substrate, a cut dummy bump, and a cut dummy solder layer, wherein the cut dummy bump and the cut dummy solder layer are over a corner portion of the cut substrate, and sidewalls of the cut substrate, the cut dummy bump, and the cut dummy solder layer are substantially coplanar; and reflowing the cut dummy solder layer to form a dummy solder ball, wherein the dummy solder ball has a curved sidewall in a top view of the dummy solder ball.

17. The method for forming the chip package structure as claimed in claim 16, further comprising:

forming a bump over the second surface of the first substrate during forming the dummy bump over the second surface, wherein the bump is electrically connected to the chip;

forming a solder layer over the bump during forming the dummy solder layer over the dummy bump; and reflowing the solder layer to form a solder ball during reflowing the dummy solder layer to form a dummy solder ball.

18. The method for forming the chip package structure as claimed in claim 17, wherein the dummy bump is thinner than the bump, the dummy solder layer is thinner than the solder layer, and the dummy solder ball is thinner than the solder ball.

19. The method for forming the chip package structure as claimed in claim 18, further comprising:

bonding the cut substrate to a second substrate through the solder ball.

20. The method for forming the chip package structure as claimed in claim 19, wherein the dummy solder ball is spaced apart from the second substrate, and the dummy solder ball is electrically insulated from the second substrate.

* * * * *